(12) United States Patent
Tseng et al.

(10) Patent No.: US 9,269,537 B2
(45) Date of Patent: Feb. 23, 2016

(54) E-BEAM LITHOGRAPHY WITH ALIGNMENT GATING

(71) Applicant: Taiwan Semiconductor Manufacturing Company, Ltd., Hsin-Chu (TW)

(72) Inventors: Nan-Hsin Tseng, Tainan (TW); Ramakrishnan Krishnan, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 195 days.

(21) Appl. No.: 13/892,806

(22) Filed: May 13, 2013

(65) Prior Publication Data

US 2014/0272712 A1    Sep. 18, 2014

Related U.S. Application Data

(60) Provisional application No. 61/783,452, filed on Mar. 14, 2013.

(51) Int. Cl.
| | | |
|---|---|---|
| *H01J 37/30* | (2006.01) | |
| *H01J 37/147* | (2006.01) | |
| *H01J 37/317* | (2006.01) | |

(52) U.S. Cl.
CPC ........... *H01J 37/3007* (2013.01); *H01J 37/147* (2013.01); *H01J 37/3174* (2013.01); *H01J 2237/31789* (2013.01)

(58) Field of Classification Search
CPC . H01J 37/3174; H01J 37/147; H01J 37/3175; H01J 2237/31789; H01J 2237/0432; H01J 2237/2485; H01J 2237/043; H01J 37/3007; G21K 5/08

See application file for complete search history.

(56) References Cited

U.S. PATENT DOCUMENTS

| | | | | |
|---|---|---|---|---|
| 6,870,172 | B1 * | 3/2005 | Mankos et al. | 250/492.22 |
| 7,358,512 | B1 * | 4/2008 | Lordi | 250/492.24 |
| 8,941,085 | B2 * | 1/2015 | Kuo et al. | 250/492.3 |
| 8,969,836 | B1 * | 3/2015 | Chen | 250/492.22 |
| 8,975,601 | B1 * | 3/2015 | Chen | 250/492.22 |
| 2006/0115752 | A1 * | 6/2006 | Latypov et al. | 430/30 |
| 2008/0169436 | A1 * | 7/2008 | Carroll | 250/492.22 |
| 2009/0026912 | A1 * | 1/2009 | Lordi et al. | 313/414 |
| 2009/0114837 | A1 * | 5/2009 | Grella et al. | 250/396 R |
| 2011/0291021 | A1 * | 12/2011 | Petric | 250/396 ML |
| 2012/0085919 | A1 * | 4/2012 | Kojima et al. | 250/396 R |
| 2013/0105108 | A1 * | 5/2013 | Zywno et al. | 165/11.1 |
| 2013/0134324 | A1 * | 5/2013 | Brodie et al. | 250/398 |
| 2013/0342827 | A1 * | 12/2013 | Ummethala et al. | 356/72 |

* cited by examiner

*Primary Examiner* — Wyatt Stoffa
(74) *Attorney, Agent, or Firm* — Haynes and Boone, LLP

(57) ABSTRACT

The present disclosure provides one embodiment of a reflective electron-beam (e-beam) lithography system. The reflective e-beam lithography system includes an e-beam source to generate an e-beam; a digital pattern generator (DPG) having a plurality of pixels that are dynamically and individually controllable to reflect the e-beam; a substrate stage designed to secure a substrate and being operable to move the substrate; an e-beam lens module configured to project the e-beam from the DPG to the substrate; and an alignment gate configured between the e-beam source and the DPG, wherein the alignment gate is operable to modulate an intensity of the e-beam.

20 Claims, 9 Drawing Sheets

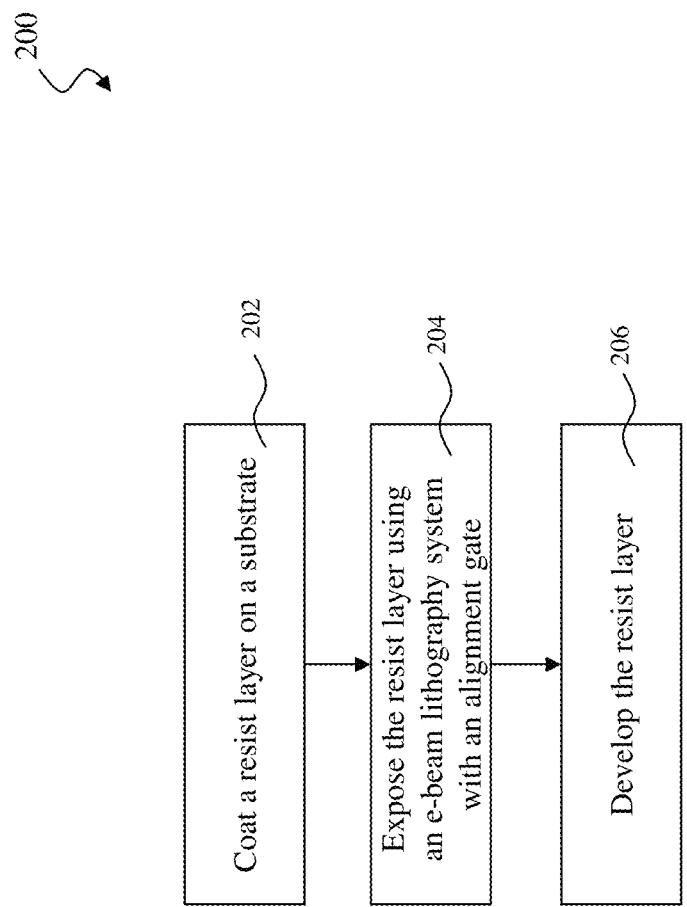

E-BEAM LITHOGRAPHY WITH ALIGNMENT GATING

PROVISIONAL REFERENCE

This application claims the benefit of U.S. Provisional Application 61/783,452 entitled "E-BEAM LITHOGRAPHY WITH ALIGNMENT GATING," filed Mar. 14, 2013, herein incorporated by reference in its entirety.

BACKGROUND

Semiconductor integrated circuit (IC) fabrication involves forming multiple material layers with designed patterns on a semiconductor wafer. Those patterned material layers on the semiconductor wafer are aligned and configured to form one or more functional circuits. Photolithography systems are used to pattern a semiconductor wafer. When semiconductor technology continues progressing to circuit layouts having smaller feature sizes, a lithography system with higher resolution is need to image an IC pattern with smaller feature sizes. An electron-beam (e-beam) system is introduced for lithography patterning processes as the electron beam has wavelengths that can be tuned to very short, resulting in very high resolution. An e-beam lithography can write small features to a wafer but takes longer time. The corresponding fabrication cost is higher and cycle time is too long. A reflective e-beam lithography system having a digital pattern generator is used to generate an e-beam pattern with the reduced cycle time. However, multiple pixels of the digital pattern generator encounter misalignment on wafer pixels due to clock skew.

It is desired, therefore, to provide an e-beam lithography system and a method for e-beam lithography patterning in IC fabrication to address the above issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

FIG. 10 is a flowchart of a method for performing an e-beam lithography process according to aspects of the present disclosure in another embodiment.

DETAILED DESCRIPTION

Figure 1:
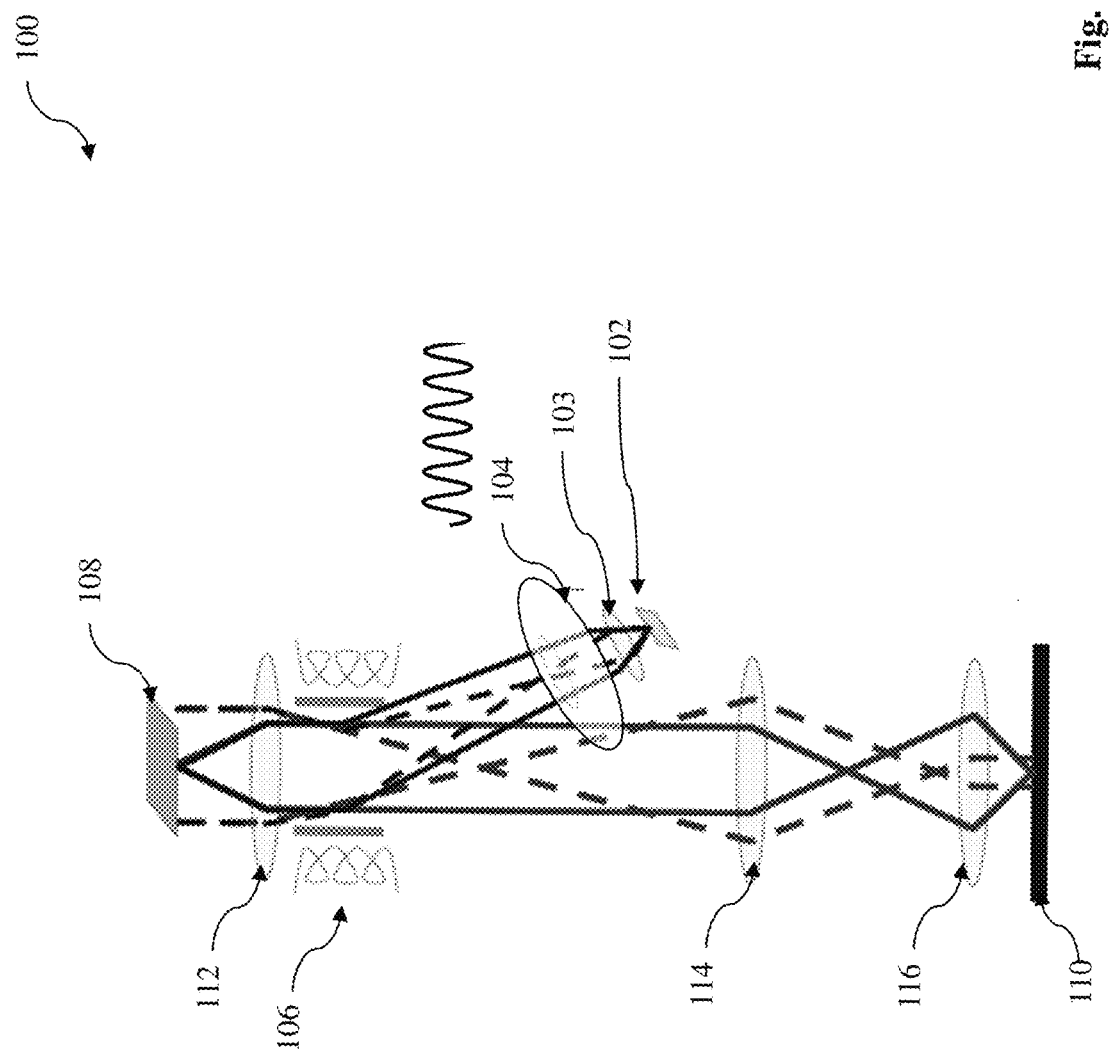
FIG. 1 is a diagrammatic view of one embodiment of an electron-beam (e-beam) lithography system for integrated circuit (IC) patterning constructed according to aspects of the present disclosure.

The present disclosure relates generally to lithography systems and a method of utilizing such systems. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 illustrates a schematic view of an electron-beam (or e-beam) lithography system 100 constructed according to aspects of one embodiment of the present disclosure. The electron-beam lithography system 100 is an electron-based lithography technique that utilizes an electron-based imaging for various integrated circuits (IC) patterning. The electron-beam lithography system 100 transfers an IC design pattern to an e-beam sensitive resist (e-beam-resist or resist) layer coated on a substrate, such as a semiconductor wafer. The electron-beam lithography system 100 provides a higher imaging resolution than that of an optical lithography because an electron beam can be energized to have a shorter wavelength. In the present embodiment, the e-beam lithography system 100 is a reflective e-beam lithography system that transfers an IC pattern to an e-beam resist layer.

The electron-beam lithography system 100 includes an electron source 102 to provide an electron beam. In furtherance of the embodiment, the electron source 102 is an electron gun with a mechanism to generate electrons, such as by thermal electron emission. In a particular example, the electron gun includes a tungsten (or other suitable material) filament designed and biased to thermally emit electrons.

The electron-beam lithography system 100 may further include e-beam lens (gun lens) 103 configured in the front of the e-beam source 102 to control the e-beam, such controlling the e-beam to have a proper direction and/or a beam size. In one embodiment, the gun lens 103 may tune the e-beam from the e-beam source 102 to have a large spot with a uniform space distribution. In another embodiment, the e-beam from the e-beam source 102 may be further processed to have a proper beam spot and uniformity by other electron lenses.

The electron-beam lithography system 100 includes an alignment gate 104 designed to modulate the e-beam in term of intensity. In one embodiment, the alignment gate 104 modulates the e-beam from the e-beam source 102 into an alternating e-beam. In furtherance of the embodiment, specifically, the alignment gate 104 modules the e-beam from the gun lens 103. The alignment gate 104 has a mechanism to modulate the e-beam into the alternating e-beam such that the intensity of the alternating e-beam changes over time, particularly changes periodically over time.

Figure 2:
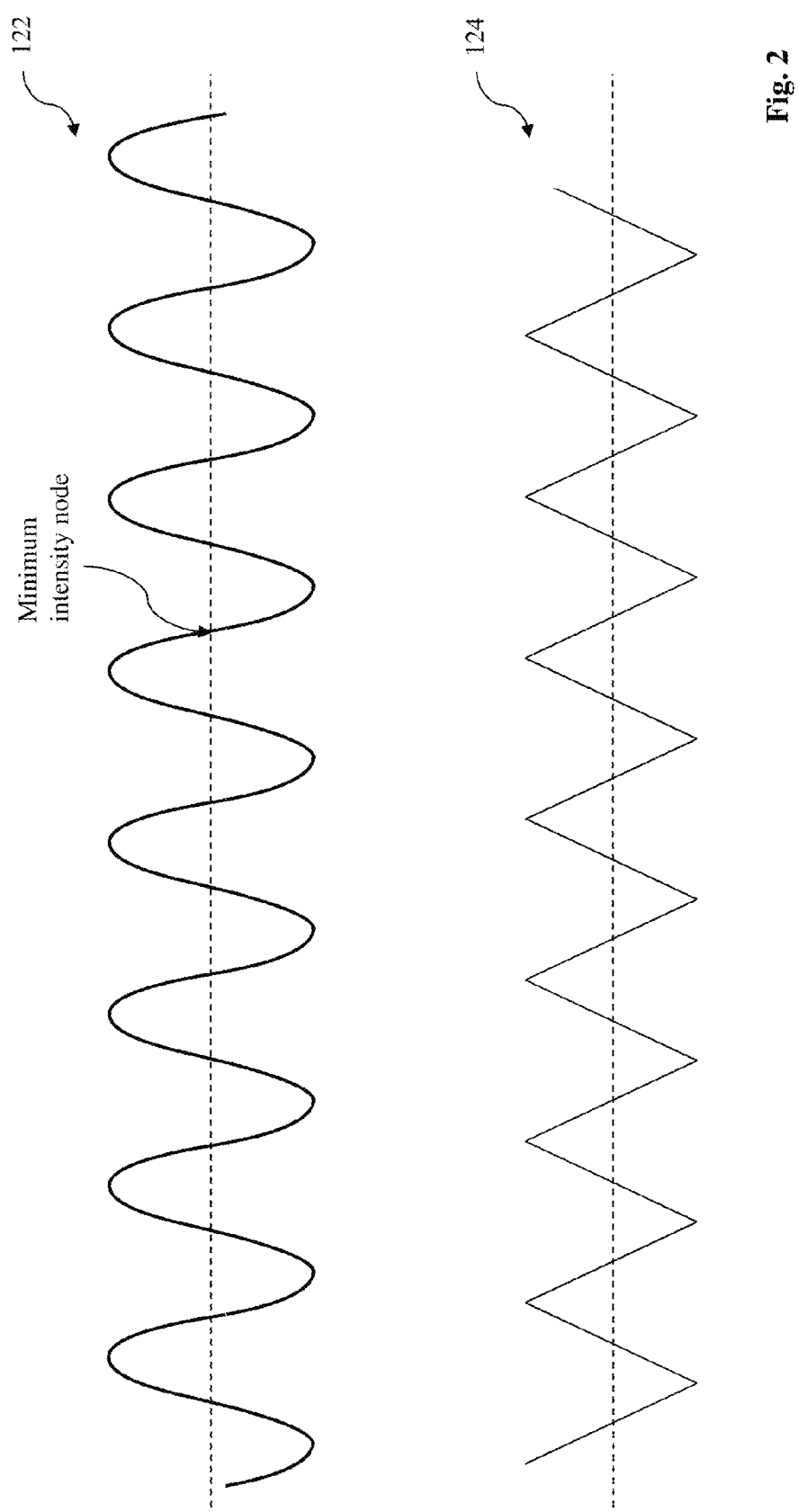
FIG. 2 illustrates various embodiments of an e-beam modulated by an alignment gate constructed according to the present disclosure.

The e-beam from the e-beam source 102 is a continuous e-beam with constant beam intensity over time. The alternating e-beam modulated by the alignment gate is an e-beam with beam intensity periodically changing over time. In one example, the alternating e-beam has an intensity changes in sine function over time such as the one 122 illustrated in FIG. 2. In another example, the alternating e-beam has an intensity changes over time in a function 124 as illustrated in FIG. 2. In yet another example, the alternating e-beam changes periodically over time in other proper function where the minimum intensity nodes are substantially zero.

The alignment gate 104 includes a proper mechanism to modulate the e-beam to form the alternating e-beam. In one embodiment, the alignment gate 104 includes a mechanism to modulate the e-beam through an electrical field. In another embodiment, the alignment gate 104 includes a mechanism to modulate the e-beam through a material layer with a dynamically controllable transmission to the e-beam. In other embodiment, the alignment gate 104 includes any suitable mechanism to effectively and dynamically control the intensity of the e-beam over time. The electron-beam lithography system 100 further includes other components synchronize the alignment gate 104 with a digital pattern generator, which will be described later.

The electron-beam lithography system 100 may include a Wien filter 106 as an e-beam filter. The Wien filter 106 includes a module to generate perpendicular electric and magnetic fields that are used as a velocity filter for the e-beam.

Figure 3:
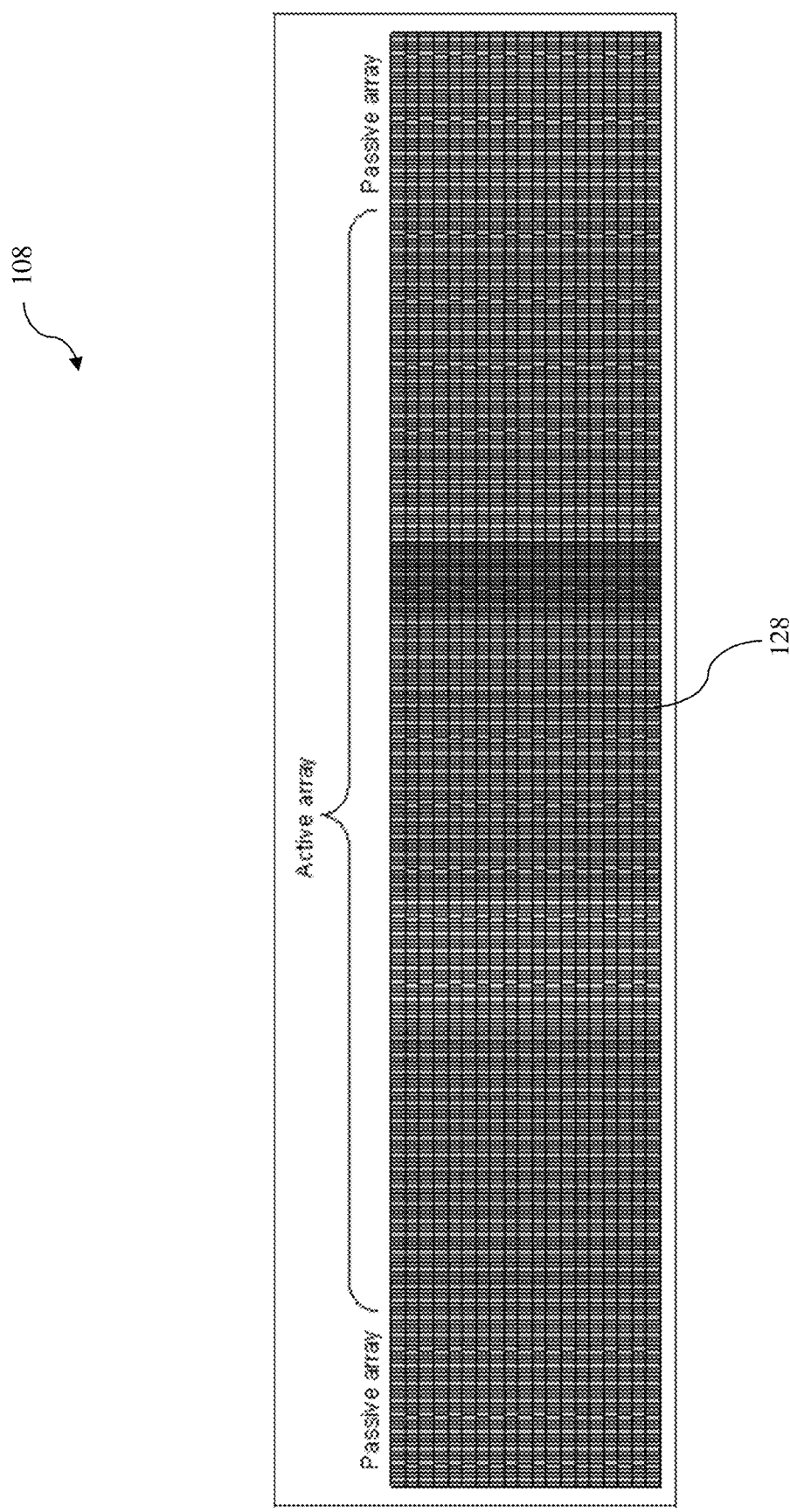
FIG. 3 is a schematic view of a DPG with a plurality of pixels constructed according to aspects of the present disclosure in one embodiment.

The electron-beam lithography system 100 includes a digital pattern generator (DPG) 108 to generate a patterned e-beam array. The DPG 108 is a structure that includes a plurality of pixels configured in an array, as illustrated in FIG. 3 constructed according to one embodiment. In this embodiment, the plurality of pixels 128 are configured in an array that spans in a rectangle. In one example, the pixels 128 include a first group as active pixels and a second group as passive pixels. The pixels are dynamically and individually controllable to on-state and off-state. For example, a first subset of the pixels is controlled to on-state and a second subset of the pixels is controlled to off-state. In this embodiment, only the active pixels are controlled to toggle between on and off states. When a pixel is on, the pixel reflects the e-beam (or a portion of the e-beam) projected on that pixel. When a pixel is off, the pixel does not reflect the e-beam (or a portion of the e-beam) projected on that pixel.

The DPG 108 includes a mechanism to enable individual pixel to toggle between on and off states. In one embodiment, the DPG 108 includes an integrated circuit (IC) based chip having an array of pixels controllable by a built-in drive circuit. In furtherance of the embodiment, the DPG 108 includes an IC chip with a complimentary metal-oxide-semiconductor filed effect transistor (CMOSFET) technology. One example of the DPG 108, in portion, is illustrated in FIG. 4 in a sectional view.

Figure 4:
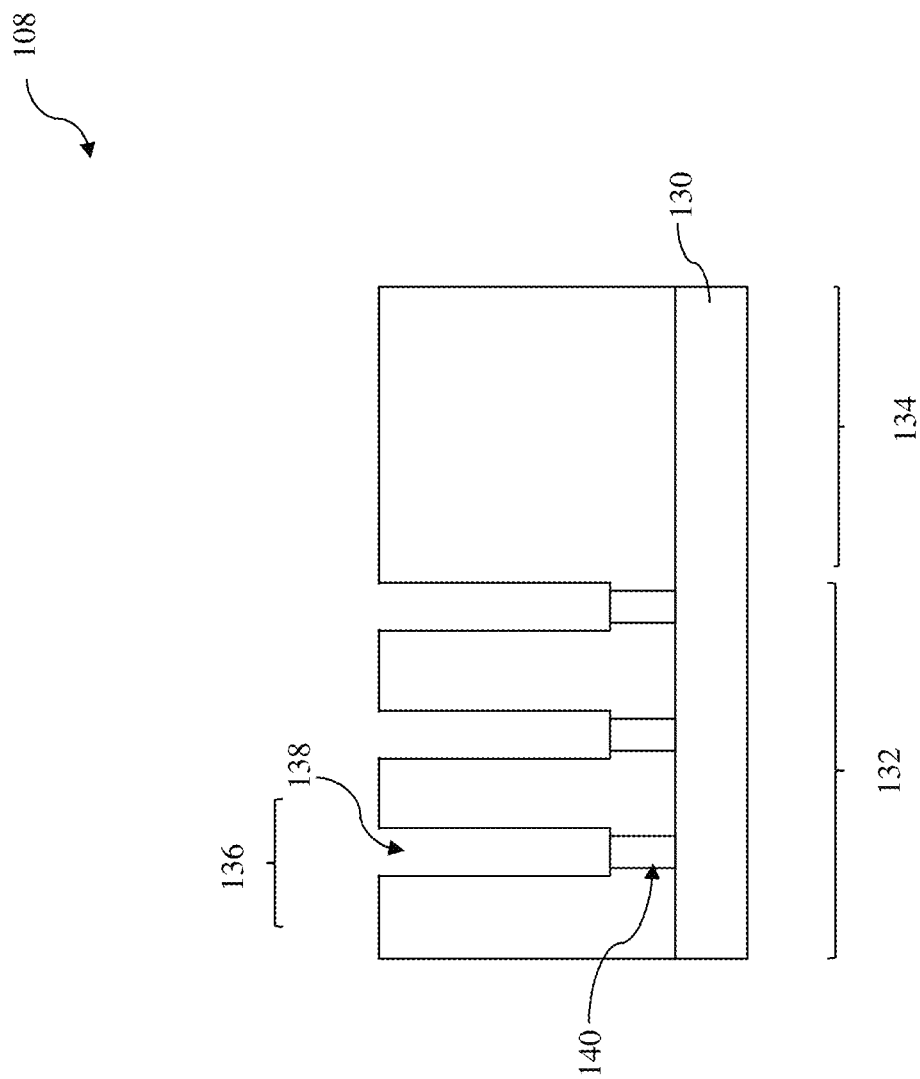
FIG. 4 is a sectional view of a GPG, in portion, constructed according to aspects of the present disclosure in one embodiment.

In FIG. 4, the DPG 108 is formed on a substrate 130 with a pixel region 132 and a circuit region 134. Three exemplary pixels 136 are shown here. Each pixel 136 includes a via (or lenslet hole) 138 and a conductive feature 140 underlying the via 138. The conductive feature is controlled to be in an on-state or an off-state. When the conductive feature (or mirror pad) 140 is in the on-state, the e-beam projected on the conductive feature is reflected. When the conductive feature 140 is in the off-state, the e-beam projected on the conductive feature is not reflected. Therefore, the conductive feature 140 is a controllable mirror to the e-beam. The DPG 108 may include other components, such as drive circuit formed in the circuit region 134.

The DPG 108 includes an array of e-beam mirror pixels that are individually and dynamically controlled to reflect an e-beam projected thereon to form an e-beam pattern. Particularly, the DPG 108 reflects the e-beam modulated by the alignment gate 104 according to a pattern defined in an IC design layout. The reflected e-beam pattern is further projected on a wafer 110 positioned on a wafer stage.

Back to FIG. 1, the e-beam lithography system 100 includes one or more lenses to impact the e-beam for imaging effect. In one embodiment, the e-beam lithography system 100 includes a DPG lens 112, an upper demagnification (demag) lens 114 and a lower demag lens 116 as illustrated in FIG. 1.

The e-beam lithography system 100 also includes other components. In the present embodiment, the e-beam lithography system 100 includes a clock circuit to drive the DPG 108. Furthermore, the clock circuit and the DPG 108 are connected to a same frequency source such that the alternating e-beam from the alignment gate 104 and the clock signal from the clock circuit are both periodic over time with a same frequency, which will be further described below.

Figure 5:
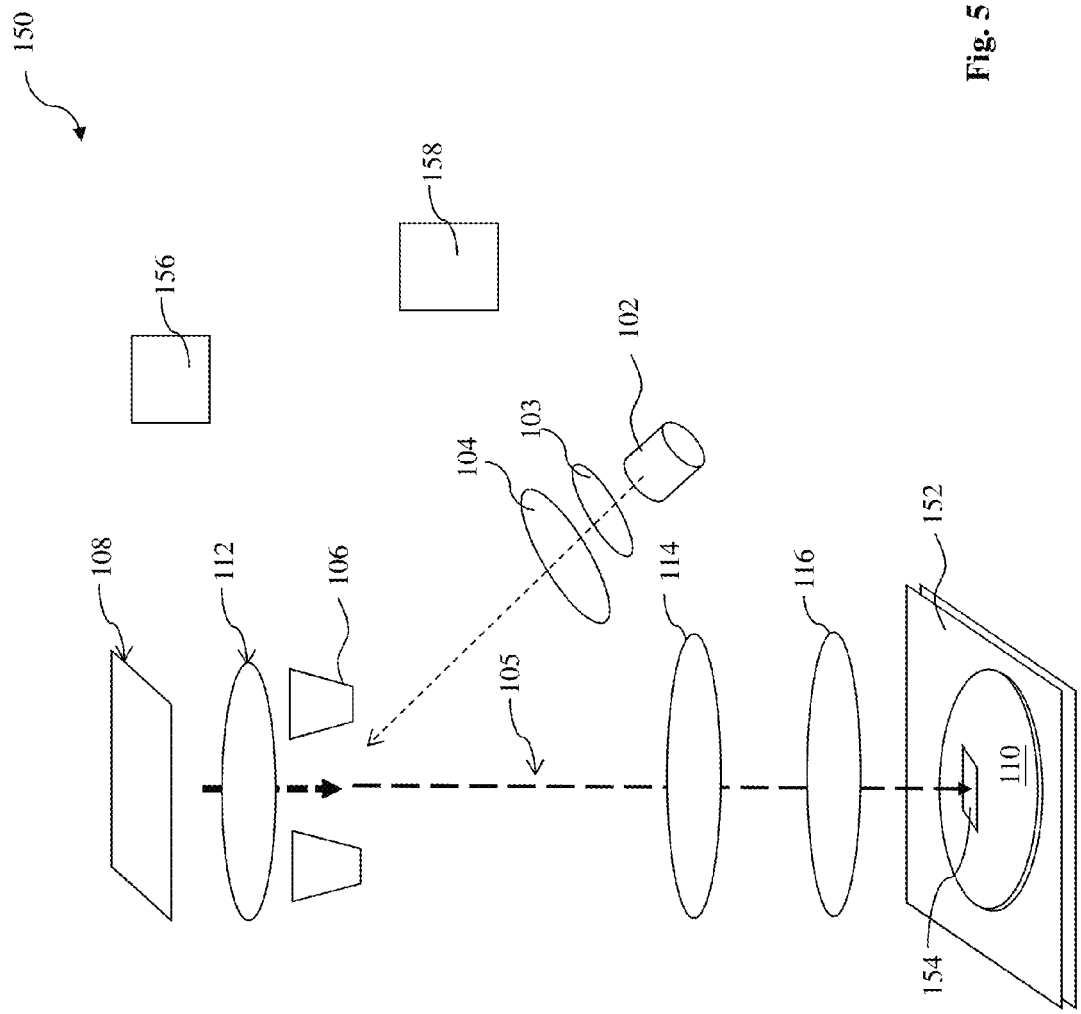
FIG. 5 is a diagrammatic view of another embodiment of an electron-beam (e-beam) lithography system for integrated circuit (IC) patterning constructed according to aspects of the present disclosure.

FIG. 5 is a schematic view of a reflective e-beam lithography system 150 constructed according to aspects of the present disclosure in another embodiment. The system 150 and a method to implement the same are collectively described with reference to FIG. 5 and other figures. The similar descriptions are not repeated for simplicity. The system 150 includes an e-beam source 102 and may further include a gun lens 103.

The system 150 includes an alignment gate 104 that is operable to dynamically modulate the intensity of the e-beam. Particularly, the alignment gate 104 modulates the e-beam into an alternating e-beam with the intensity periodically changing over time. In one embodiment, the alignment gate 104 further includes a drive circuit to the alignment gate for dynamical intensity modulation of the e-beam so that the alternating e-beam from the alignment gate has a periodic change over time, such as those 122 and 124 shown in FIG. 2.

The system 150 includes a DPG 108 designed to have a plurality of mirror pixels in an array. The mirror array is operable so that each pixel is dynamically and individually controlled to an on-state to reflect the e-beam or an off-state to not reflect. The system 150 also includes a Wien filter 106 and a DPG lens 112 properly configured. The system 150 further includes other lens features, such as an upper demag lens 114 and a lower demag lens 116 properly configured for proper imaging effect. Various lenses, such as magnets, are designed to provide force to the electrons for proper imaging effect, such as focusing, or demagnification.

The system 150 also includes a wafer stage 152 to secure a wafer 110. In the present embodiment, the wafer 110 is coated with a resist layer to be patterned in a lithography process by the system 150. The resist layer includes a resist material sensitive to electrons (so also referred to as e-beam resist). The resist material includes a component that resist to an IC fabrication process, such as etch and/or ion implantation. The resist material further includes a component sensitive to electrons. The resist material may be negative tone or positive tone. In one example, the resist material includes polymethyl methacrylate (PMMA).

In one embodiment, the wafer stage 152 is operable to move transitionally or rotationally such that an e-beam is directed to various locations of the resist layer on the wafer 110. In one example, the wafer stage 152 and the DPG 108 are designed to coordinately move the e-beam relative to the wafer 110. Particularly, in the present embodiment, the wafer 110 includes a plurality of regions (fields) 154 to be patterned.

In another embodiment, the wafer stage 152 is designed to secure multiple wafers so that the multiple wafers are exposed in a same lithography process. In one example, the multiple wafers secured on the wafer stage 152 are configured in a circle and the wafer stage 152 is operable to move in a rotational mode. In another example, the multiple wafers secured on the wafer stage 152 are configured in an array and the wafer stage 152 is operable to move in a transitional mode.

The system 150 also includes a clock circuit module 156 to drive the DPG 108 such that the mirror pixels change states along with the clock signal from the clock circuit module 156.

The system 150 also includes a frequency source 158 to generate an alternating signal of a certain frequency, such as 50 MHz. The frequency source 158 is connected to both the alignment gate 108 to synchronize the both. In the present embodiment, the alternating e-beam from the alignment 108 and the clock signal from the clock module 156 are synchronized to have a same frequency, such as the frequency of the frequency source 156. In furtherance of the embodiment, the alternating e-beam from the alignment 108 and the clock signal from the clock module 156 are synchronized to be substantially in phase such that minimum intensity nodes of the alternating e-beam are substantially aligned with the edges of the clock signal, which will be further described below.

Figure 6:
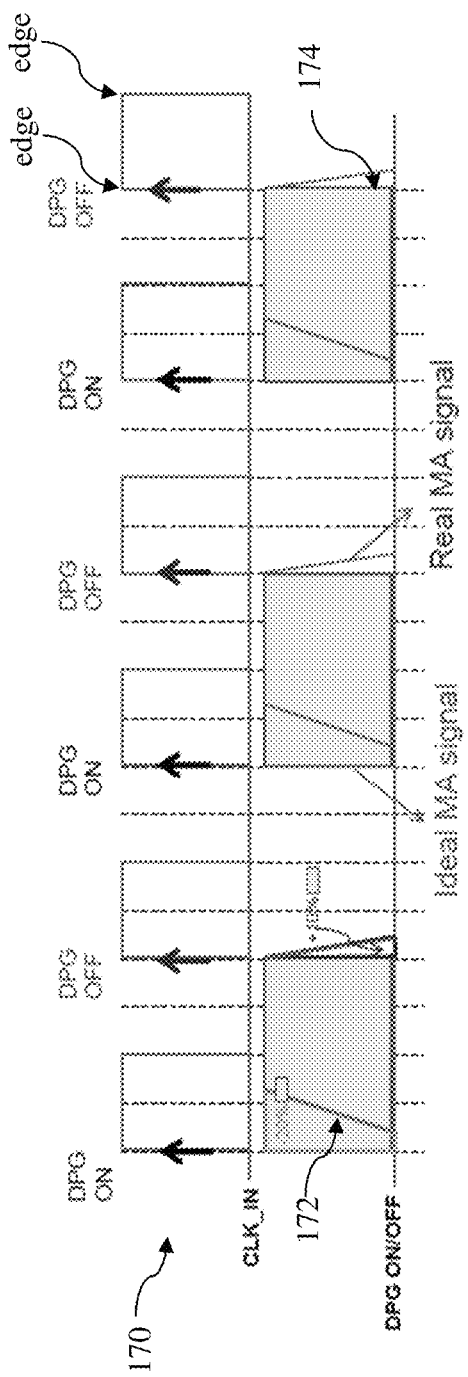
FIG. 6 illustrates a clock signal to a digital pattern generator (DPG) and the e-beam reflected from the DPG constructed according to aspects of the present disclosure in one embodiment.
Figure 7:
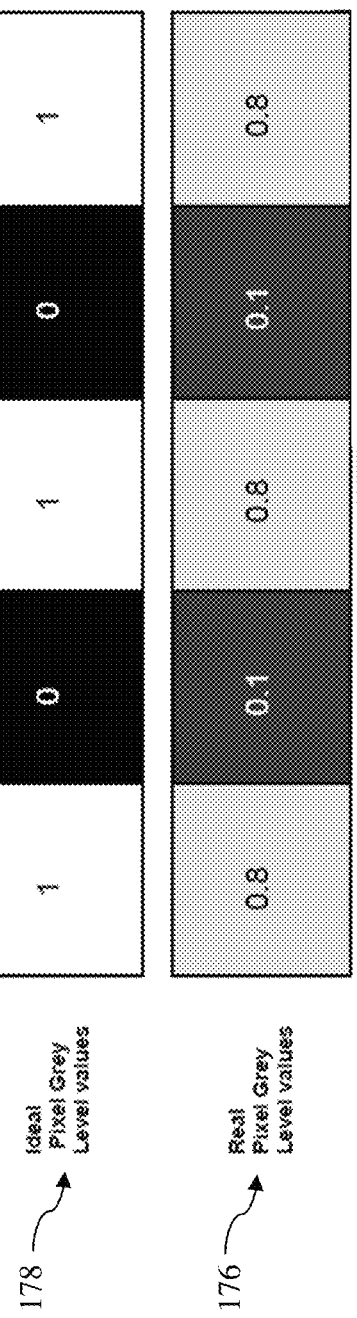
FIG. 7 illustrates e-beam pixel intensities on a wafer without alignment gating constructed according to one or more embodiment.

FIG. 6 illustrates the clock signal 170 and mirror array signal. Particularly, for the mirror array signal, the on/off state 172 of a DPG pixel and an ideal on/off state 174 of the DPG pixel for reference. FIG. 7 illustrates e-beam pixel intensities on a wafer without alignment gating constructed according to one or more embodiment. Specifically, FIG. 7 illustrates grey level of the exposure dosage on the wafer pixels with the corresponding DPG on/off states illustrated in FIG. 6. Particularly, the grey level profile 176 corresponds to the on/off state 172 for a real case. The grey level profile 178 corresponds to the on/off state 174 for an ideal case. One pixel of the DPG exposes multiple pixels on the wafer since the wafer moves relatively to the DPG 108. In FIG. 7, 5 wafer pixels are illustrated.

Referring to FIG. 6, the clock signal 170 includes two signal levels (high and low). The time points associate from high level to low level or low level to high level are respectively referred to down edge and up edge of the clock signal. A DPG pixel is triggered by the up edges of the clock signal to turn on or turn off the mirror pixel of the DPG. The ideal response of the DPG is illustrated in the ideal on/off signal 174 and the corresponding pixel grey level profile (pattern) is 178. In this case, a first wafer pixel has a grey level as 1, and a second wafer pixel has a grey level as 0, and so on.

In reality, due to time skew, the DPG response is delayed. The real response of the DPG is illustrated in the on/off signal 172 and the signal is delayed and is gradually increased to the on-state or is gradually decreased to off-state. The real corresponding pixel grey level profile is 176. In this case, a first wafer pixel has a grey level less than 1 (such as 0.8), and a second wafer pixel has a grey level greater than 0 (such as 0.1), and so on.

By utilizing the alignment gate 104, especially, the alternating e-beam is synchronized with the clock signal so that the minimum intensity nodes of the alternating e-beam are substantially aligned to the edges of the clock signal, the mirror signal deviation (or the e-beam intensity deviation) caused by the time skew is minimized since the e-beam intensity associated with the time skew is much less. It is further explained with the reference to FIG. 8.

Figure 8:
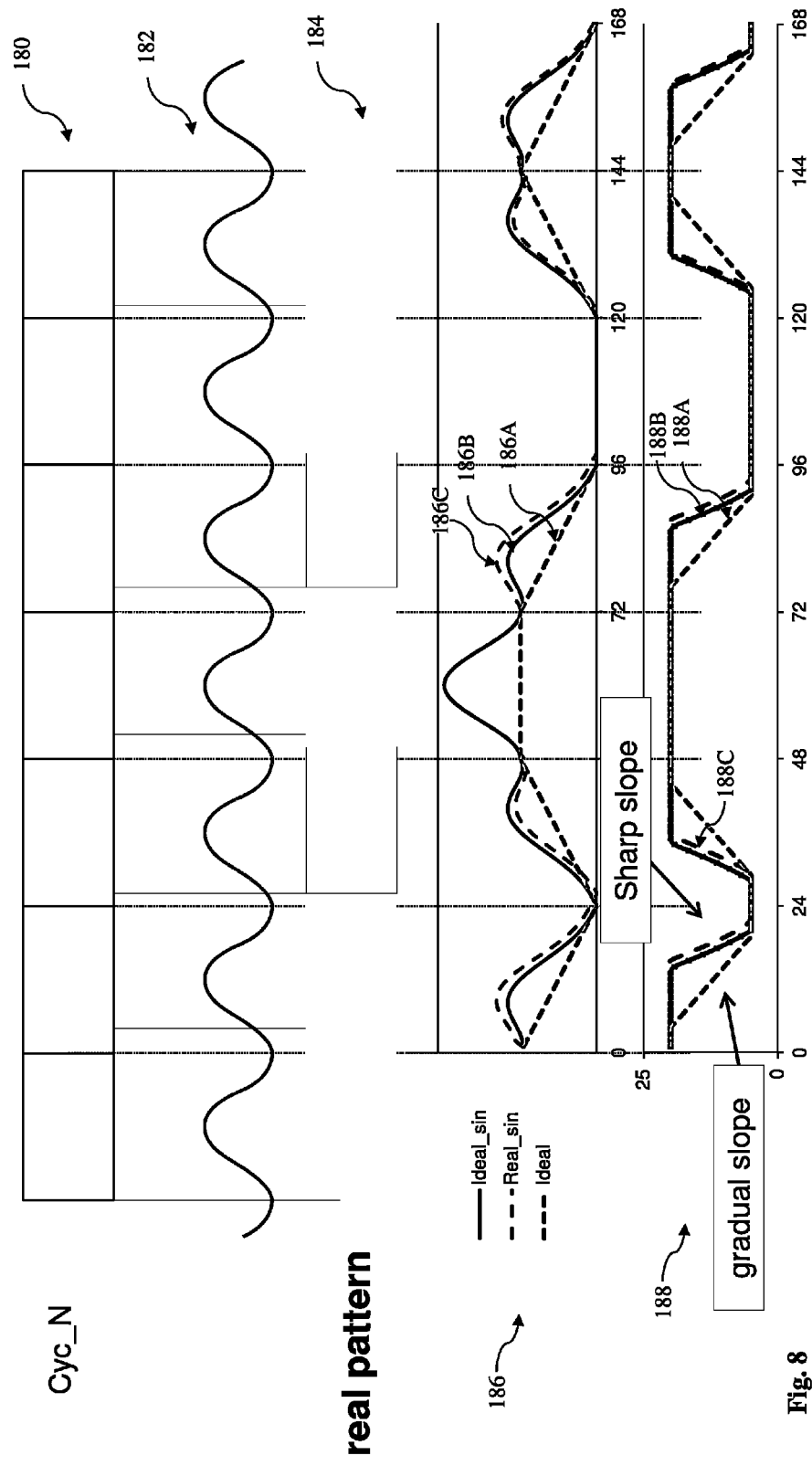
FIG. 8 is a diagrammatic view of e-beam intensities on wafer pixels constructed according to the present disclosure in one embodiment.

In FIG. 8, the expected ideal wafer pixel grey level profile (pattern) is illustrated in 180 and intensity profile of the alternating e-beam from the alignment gate 104 is illustrated in 182. In this case, the intensity profile 182 is a sine wave achieved by the alignment gate 103. The real wafer pixel grey level profile (pattern) is illustrated in 184. The deviation caused by the time skew is minimized since the e-beam in the skew zone is minimized in the intensity.

It is further shown on other diagrams of the e-beam intensity of FIG. 8. Diagram 186 illustrates the signal of the DPG pixel over wafer locations (or wafer pixels). Particularly, the first curve 186A shows the signal of the DPG pixel to the wafer pixels. The second curve 186B shows the alternating e-beam intensity vs. the wafer pixels relative to the signal of the DPG pixel without time skew. The third curve 186C illustrates the alternating e-beam intensity to the wafer pixels vs. the signal of the DPG pixel with time skew.

The intensity of the e-beam from the DPG is a collective result of the DPG and alignment gate. For example, the alternating e-beam has a signal as $I_1$ (that changes periodically) and the DPG (one pixel of the DPG) has a signal $I_2$ (that changes digitally to 1 or 0). The final intensity of the e-beam from the DPG is determined by $I_1 * I_2$. Diagram 188 illustrates the final e-beam intensity, for respective cases. The first curve 188A is the final e-beam intensity without modulation from the alignment gate. The second curve 188B is the final e-beam intensity with the modulation from the alignment gate. The third curve 188C is the final e-beam intensity with the modulation and with time skew. From the diagram 188, with the modulation of the alignment gate, the final e-beam intensity has a more sharp profile, which is more close to the expected profile.

Figure 9:
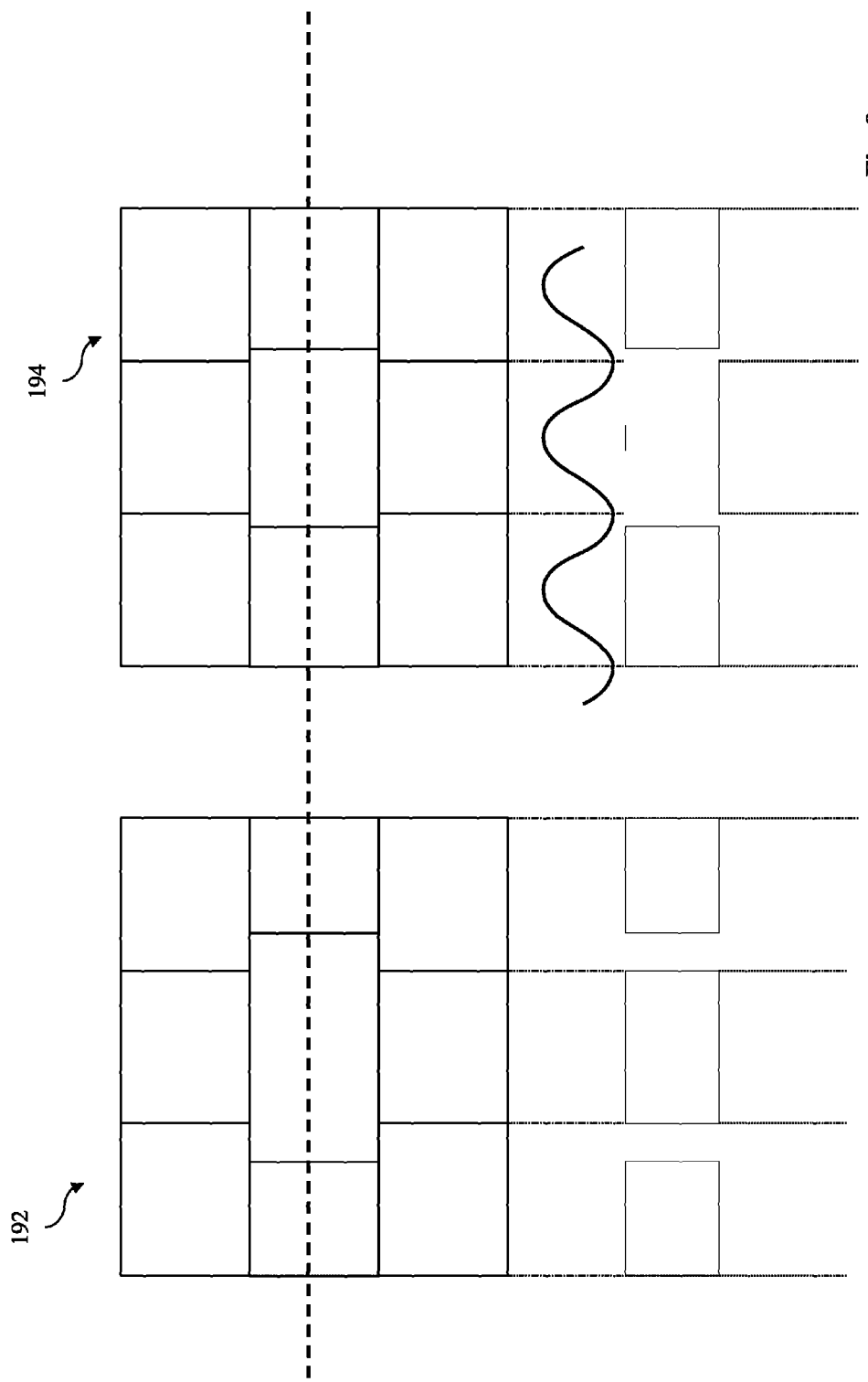
FIG. 9 is a diagrammatic view of e-beam intensities on wafer pixels constructed according to various embodiments.

Various advantages may present in different embodiments of the present disclosure. In one embodiment, the exposure dose deviation is minimized with the modulation of the alignment gate, as illustrated in FIG. 9 in a top view. Diagram 192 shows a wafer exposure dose profile without using the alignment gate 104. There are 9 wafer pixels in the diagram 192. The center pixel is expected to have a dose 1 and the other pixels are expected to have a dose 0. Due to time skew, the exposed area is extended out the pixel region. Diagram 194 shows a wafer exposure dose profile with utilization of the alignment gate 104. The dose variation on the wafer pixel is minimized by using the modulated e-beam from the alignment gate 104.

In another embodiment, it is advantageous to control the intensity of the e-beam by the alignment gate 104 after the e-beam is generated from the e-beam source 102. It is more difficult to directly control the e-beam source 102 since the e-beam source 102 is associated with high voltage.

FIG. 10 is a flowchart of a method 200 to perform a lithography patterning process using the e-beam lithography system (such as the system 100 or 150) with the alignment gate 108, constructed according to various aspects of the present disclosure in one embodiment. The method 200 begins at operation 202 by coating a resist layer on a substrate, such as a silicon wafer. The method 200 proceeds to operation 204 by performing a lithography exposing process using the e-beam lithography system with the alignment gate 108.

Particularly, the resist layer is exposed by a pattern e-beam generated by the DPG 108. The patterned e-beam is controlled according to an IB design layout. Especially, the e-beam pattern dynamically changes over time while the substrate moves relative to the DPG in one of transitional mode and rotational mode. Furthermore, the e-beam patterned is generated from an alternating e-beam. The alternating e-beam changes periodically over time and is controlled by the alignment gate 104.

The method 200 proceeds to operation 206 by developing the exposed resist layer in a developing solution to form a patterned resist layer. The method 200 may further include other operations implemented before, during and/or after the operations described above. For example, the method 200 may include various baking steps, such as soft baking, post-exposure baking or hard baking. In another example, the method 200 further includes an etch process applied to the substrate using the patterned resist layer as an etch mask. In yet another example, the method 200 further includes an ion implantation process applied to the substrate using the patterned resist layer as an implantation mask.

Thus, the present disclosure provides one embodiment of a reflective electron-beam (e-beam) lithography system. The system includes an e-beam source to generate an e-beam; a digital pattern generator (DPG) having a plurality of pixels that are dynamically and individually controllable to reflect the e-beam; a substrate stage designed to secure a substrate and being operable to move the substrate; an e-beam lens module configured to project the e-beam from the DPG to the substrate; and an alignment gate configured between the e-beam source and the DPG, wherein the alignment gate is operable to modulate an intensity of the e-beam.

In one embodiment, the alignment gate includes a mechanism to modulate the intensity of the e-beam through an electrical field. In another embodiment, the alignment gate includes a mechanism with a controllable transmission to modulate the intensity of the e-beam.

In yet another embodiment, the alignment gate is operable to modulate the e-beam to an alternating e-beam with e-beam intensity changing periodically over time. In one example, the alignment gate is operable to modulate the e-beam to an alternating e-beam with e-beam intensity as a sine function of time.

In yet another embodiment, the system further includes a clock circuit to generate a clock signal to drive the DPG. The clock signal is a periodic signal of a first frequency. The alternating e-beam has a periodic intensity of a second frequency. The first and second frequencies are equal.

In yet another embodiment, the system further includes a frequency source to generate an electrical signal of a third frequency. The frequency source is coupled with the clock circuit and the alignment gate. The first and second frequencies equal to the third frequency.

In yet another embodiment, the alignment gate is configured and controlled such that the alternating e-beam is substantially in phase with the clock signal.

In yet another embodiment, the alternating e-beam is substantially in phase with the clock signal such that minimum intensity nodes of the alternating e-beam are substantially aligned with edges of the clock signal.

In yet another embodiment, each of the pixels in the DPG is operable to be in one of on-state and off-state according to a pattern defined from an IC design layout. The e-beam modulated by the alignment gate is projected to the plurality of pixels in the DPG simultaneously and is reflected from the DPG as an e-beam array that carries the pattern.

The present disclosure also provides another embodiment of an electron-beam (e-beam) lithography system. The system includes an e-beam source to generate an e-beam; an alignment gate being operable to modulate an intensity of the e-beam to an alternating e-beam; a digital pattern generator (DPG) having pixels configured in an array to generate an e-beam pattern from the alternating e-beam; a substrate stage designed to secure a substrate and being operable to move the substrate; and an e-beam lens module configured to project the e-beam pattern on the substrate.

In one embodiment, the alignment gate is configured between the e-beam source and the DPG, and the alignment gate is operable to modulate the intensity of the e-beam to form the alternating e-beam so that the modulated intensity changes periodically over time.

In another embodiment, the alignment gate includes a mechanism to modulate the intensity of the e-beam by an electrical field.

In yet another embodiment, the alignment gate includes a material layer with a controllable transmission to modulate the intensity of the e-beam.

In yet another embodiment, the system further includes a clock circuit to generate a clock signal to the DPG; and a frequency source coupled to the clock circuit and the alignment gate such that the clock signal and the alternating e-beam are synchronized to have a same frequency.

In yet another embodiment, the frequency source synchronizes the clock circuit and the alignment gate such that minimum intensity nodes of the alternating e-beam are substantially aligned with edges of the clock signal. In yet another embodiment, the pixels in the DPG are operable to have a first subset of the pixels reflecting the alternating e-beam and a second subset of the pixels without reflection.

The present disclosure also provides one embodiment of a lithography process. The lithography process includes coating a resist layer on a substrate; exposing the resist layer by an e-beam lithography system; and developing the resist layer to form a patterned resist layer. The lithography system includes an e-beam source to generate an e-beam; an alignment gate being operable to modulate an intensity of the e-beam to an alternating e-beam; and a digital pattern generator (DPG) having pixels configured in an array to generate an e-beam pattern from the alternating e-beam.

In one embodiment, the exposing the resist layer by an e-beam lithography system includes exposing the resist layer by the e-beam pattern that dynamically changes over time while the substrate moves relative to the DPG in one of transitional mode and rotational mode. In another embodiment, the alternating e-beam changes periodically over time.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A reflective electron-beam (e-beam) lithography system, comprising:
   an e-beam source to generate an e-beam;
   a digital pattern generator (DPG) having a plurality of pixels that are dynamically and individually controllable to reflect the e-beam;
   a substrate stage designed to secure a substrate and being operable to move the substrate;
   an e-beam lens module configured to project the e-beam from the DPG to the substrate; and an alignment gate configured between the e-beam source and the DPG, wherein the alignment gate is operable to modulate the e-beam to an alternating e-beam with e-beam intensity as a sine function of time.

2. The reflective e-beam lithography system of claim 1, wherein the alignment gate includes a mechanism to modulate the intensity of the e-beam through an electrical field.

3. The reflective e-beam lithography system of claim 1, wherein the alignment gate includes a mechanism with a controllable transmission to modulate the intensity of the e-beam.

4. The reflective e-beam lithography system of claim 1, wherein the substrate stage is designed to secure a plurality of substrates configured in a circle.

5. The reflective e-beam lithography system of claim 1, wherein
   each of the pixels in the DPG is operable to be in one of on-state and off-state according to a pattern defined in a design layout; and
   the e-beam modulated by the alignment gate is projected to the plurality of pixels in the DPG simultaneously and is reflected from the DPG as an e-beam array that carries the pattern.

6. A reflective electron-beam (e-beam) lithography system, comprising:
   an e-beam source to generate an e-beam;
   a digital pattern generator (DPG) having a plurality of pixels that are dynamically and individually controllable to reflect the e-beam;
   a substrate stage designed to secure a substrate and being operable to move the substrate;
   an e-beam lens module configured to project the e-beam from the DPG to the substrate; and
   an alignment gate configured between the e-beam source and the DPG, wherein the alignment gate is operable to modulate the e-beam to an alternating e-beam with e-beam intensity changing periodically over time;
   a clock circuit to generate a clock signal to drive the DPG, wherein
   the clock signal is a periodic signal of a first frequency;
   the alternating e-beam by the alignment gate has a periodic intensity of a second frequency; and
   the first and second frequencies are equal.

7. The reflective e-beam lithography system of claim 6, further comprising a frequency source to generate an electrical signal of a third frequency, wherein
   the frequency source is coupled with the clock circuit and the alignment gate; and
   the first and second frequencies equal to the third frequency.

8. The reflective e-beam lithography system of claim 6, wherein the alignment gate is configured and controlled such that the alternating e-beam is substantially in phase with the clock signal.

9. The reflective e-beam lithography system of claim 8, wherein the alternating e-beam is substantially in phase with the clock signal such that minimum intensity nodes of the alternating e-beam are substantially aligned with edges of the clock signal.

10. The e-beam lithography system of claim 6, wherein the alignment gate includes a mechanism to modulate the intensity of the e-beam through an electrical field.

11. The e-beam lithography system of claim 6, wherein the alignment gate includes a mechanism with a controllable transmission to modulate the intensity of the e-beam.

12. The e-beam lithography system of claim 6, wherein the substrate stage is designed to secure a plurality of substrates configured in a circle.

13. The reflective e-beam lithography system of claim 6, wherein the e-beam is substantially in phase with the clock signal such that minimum intensity nodes of the e-beam are substantially aligned with edges of the clock signal.

14. An electron-beam (e-beam) lithography system, comprising:
   an e-beam source to generate an e-beam;
   an alignment gate being operable to modulate an intensity of the e-beam to an alternating e-beam;
   a digital pattern generator (DPG) having pixels configured in an array to generate an e-beam pattern from the alternating e-beam;
   a substrate stage designed to secure a substrate and being operable to move the substrate;
   an e-beam lens module configured to project the e-beam pattern on the substrate;
   a clock circuit to generate a clock signal to the DPG; and
   a frequency source coupled to the clock circuit and the alignment gate such that the clock signal and the alternating e-beam are synchronized to have a same frequency.

15. The e-beam lithography system of claim 14, wherein the alignment gate is configured between the e-beam source and the DPG, and the alignment gate is operable to modulate the intensity of the e-beam so that the modulated intensity changes periodically over time.

16. The e-beam lithography system of claim 14, wherein the alignment gate includes a mechanism to modulate the intensity of the e-beam by an electrical field.

17. The e-beam lithography system of claim 14, wherein the alignment gate includes a material layer with a controllable transmission to modulate the intensity of the e-beam.

18. The e-beam lithography system of claim 14, wherein the frequency source synchronizes the clock circuit and the alignment gate such that minimum intensity nodes of the alternating e-beam are substantially aligned with edges of the clock signal.

19. The e-beam lithography system of claim 18, wherein the minimum intensity nodes of the alternating e-beam have intensities substantially zero.

20. The e-beam lithography system of claim 14, wherein the pixels in the DPG are operable to have a first subset of the pixels reflecting the alternating e-beam and a second subset of the pixels without reflection.

* * * * *